United States Patent [19]
Suzuki et al.

[11] Patent Number: 5,591,563
[45] Date of Patent: Jan. 7, 1997

[54] PHOTOCURABLE RESINS FOR STEREOLITHOGRAPHY AND COMPOSITIONS CONTAINING SAME

[75] Inventors: Toshiharu Suzuki; Tatsuhiko Ozaki; Hirokazu Matsueda, all of Aichi, Japan

[73] Assignee: Takemoto Yushi Kabushiki Kaisha, Japan

[21] Appl. No.: 550,563

[22] Filed: Oct. 30, 1995

[30] Foreign Application Priority Data

Dec. 28, 1994 [JP] Japan .................................. 6-340048

[51] Int. Cl.$^6$ ........................................ C08F 26/06
[52] U.S. Cl. ........................ 430/284.1; 522/96; 525/404; 525/450
[58] Field of Search ........................... 430/284.1; 522/96; 525/404, 450

[56] References Cited

U.S. PATENT DOCUMENTS 4,942,001 7/1990 Murphy et al. ......................... 522/96
5,116,186 11/1992 Kojime et al. .......................... 522/96

FOREIGN PATENT DOCUMENTS 6-16721A    1/1994  Japan .................................. 522/96
6-287241A2 10/1994 Japan .................................. 522/96
7-188382    7/1995  Japan ............................. 430/280.1

*Primary Examiner*—Cynthia Hamilton
*Attorney, Agent, or Firm*—Majestic, Parsons, Siebert & Hsue

[57] ABSTRACT

Photocurable resins containing unsaturated urethane of a specified form and vinyl monomer which is N-(meth)acryloylmorpholine or its mixture with di-ol di(meth)acrylate at a rate within a specified range and compositions containing such a resin and a filler such as solid particles and/or inorganic whiskers of specified kinds at a specified rate are capable of yielding stereolithographed objects with improved mechanical and thermal properties and form precision.

12 Claims, No Drawings

PHOTOCURABLE RESINS FOR STEREOLITHOGRAPHY AND COMPOSITIONS CONTAINING SAME

BACKGROUND OF THE INVENTION

This invention relates to photocurable resins for stereolithography and compositions containing such resins.

Numerically controlled cutting process methods are used for the production of various kinds of models such as mold production models, profiling process models and die-sinking electric discharge process models as well as regular shape products. More recently, attention is being paid to the optical stereolithography whereby a photocurable resin or its composition is exposed to a radiation for hardening to form a desired stereo lithographed object. This invention relates to photocurable resins suitably adapted to such processes in stereolithography, and more particularly to photocurable resins for stereolithography containing unsaturated urethane and compositions containing such resins.

Examples of known photocurable resins for stereolithography containing unsaturated urethane include (1) those containing unsaturated urethane obtained from polyurethane diisocyanate and hydroxy alkyl acrylate (such as disclosed in Japanese Patent Publication Tokkai 2-145616), (2) those containing unsaturated urethane obtained from polyurethane diisocyanate and triol di(meth)acrylate (such as disclosed in Japanese Patent Publications Tokkai 1-204915 and U.S. Pat. No. 4,879,402), (3) those containing unsaturated urethane obtained from polyurethane diisocyanate and tetraol triacrylate (such as disclosed in U.S. Pat. No. 4,608,409), (4) those containing unsaturated urethane obtained from polyurethane tri--hexa-isocyanate and tri-ol di(meth)acrylate (such as disclosed in U.S. Pat. No. 4,879,402), (5) those containing unsaturated urethane obtained from triisocyanate and diol mono(meth)acrylate or tri-ol di(meth)acrylate (such as disclosed in U.S. Pat. No. 4,868,325), and (6) those containing unsaturated urethane obtained from diisocyanate and triol di(meth)acrylate (such as disclosed in U.S. Pat. No. 4,347,174). If an attempt is made to increase the double bond density within such unsaturated urethane so as to increase the crosslinking density of resulting stereolithographed objects, however, shrinkage becomes large at the time of photopolymerization reaction and the form precision of the resulting object becomes worse. If it is attempted, on the other hand, to reduce the double bond density within the unsaturated urethane so as to reduce the crosslinking density of the resulting stereolithographed object, thermal properties of such objects are adversely affected and, for example, their thermal deformation temperatures become lower.

In view of the above, there have been attempts to improve both the shrinkage at the time of reaction and the thermal properties by using unsaturated urethane of a kind having both polymerizable and long-chain hydrocarbon groups within the molecule, as disclosed, for example, in Japanese Patent Publications Tokkai 6-234818, 6-322039 and 6-287241. Although such prior art attempts could reduce the reaction shrinkage to a certain extent at the time of the photopolymerization reaction, it was not possible, as a matter of fact, to necessarily obtain stereolithographed objects with superior form precision. The reason for this is the existence of non-uniform stress inside the resulting objects caused by the material non-uniformity within the photocurable resin or its composition which has been used, non-uniformity in the photopolymerization reaction, and the shape of the stereolithographed object to be obtained. If the force of such stress becomes concentrated in a particular part of the object or a particular direction therein, there may result a deformation such as curvature, torsion and crush, as well as a fracture such as cracks and delamination. Thus, the form precision of such stereolithographed objects having such an internal stress is intrinsically inferior. In general, mechanical and thermal properties of stereolithographed objects obtained from prior art photocurable resins or their compositions, even with the aforementioned proposed attempts, are inferior. In particular, their toughness factor, defined as the product of the tensile strength and tensile elongation, is significantly inferior to the toughness factor of an ordinary thermoplastic resin such as the ABS resin commonly used as the material for plastic molding. Thus, the stereolithographed objects thus obtained can be used only for limited purposes.

SUMMARY OF THE INVENTION

It is therefore an object of this invention to overcome the aforementioned problem of photocurable resins for stereolithography containing unsaturated urethane of a prior art kind, as well as their compositions, that is, the properties, and in particular the mechanical properties and form precision, of stereolithographed objects obtained therefrom are inferior.

In view of the above and other objects, the present inventors focussed their attention to unsaturated urethane having both polymerizable and long-chain hydrocarbon groups within the molecule and studied the relationship between the chemical structures of such unsaturated urethane and the vinyl monomers to be used therewith and the form precision, thermal and mechanical properties of the stereolithographed objects obtained therefrom. As a result of such studies, it has been discovered that the objects of the invention can be accomplished if unsaturated urethane having a specified structure and a specified type of vinyl monomer containing N-(meth)acryloylmorpholine are used at specified rates.

DETAILED DESCRIPTION OF THE INVENTION

This invention relates to a photocurable resin for stereolithography comprising unsaturated urethane shown by Formula (1) or Formula (2) given below:

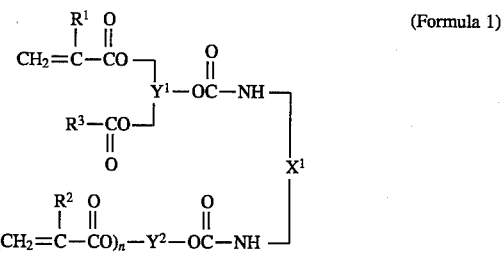

(Formula 1)

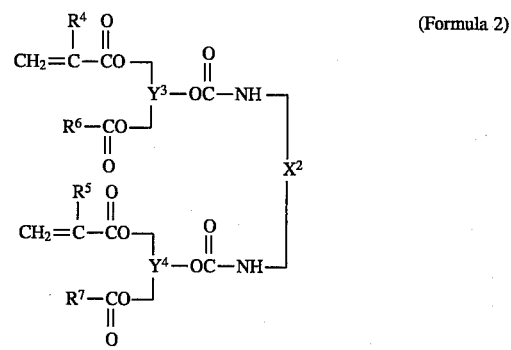

(Formula 2)

and a vinyl monomer and a photoinitiator, the vinyl monomer being N-(meth)acryloyl morpholine selected from N-acryloyl morpholine, N-methacryloyl morpholine and mixtures thereof or a mixture of such N-(meth)acryloyl morpholine di-ol di(meth)acrylate selected from di-ol diacrylate, di-ol dimethacrylate and a mixture thereof, the ratio between said unsaturated urethane and said vinyl monomer being 100/25–100/150 by weight, wherein $X^1$ and $X^2$ are each a residual group obtained by removing isocyanate groups from diisocyanate; $Y^1$, $Y^3$ and $Y^4$ are each a residual group obtained by removing hydroxyl groups from trihydric alcohol; $Y^2$ is a residual group obtained by removing hydroxyl groups from dihydric or trihydric alcohol; $R^1$, $R^2$, $R^4$ and $R^5$ are each H or $CH_3$; $R^3$, $R^6$ and $R^7$ are each alkyl group with 5–21 carbon atoms; and n is either 1 or 2.

Unsaturated urethane shown by Formula (1) is a reaction product of a urethane-producing reaction of (meth)acrylic acid-long-chain aliphatic acid mixed ester mono-ol (hereinafter referred to simply as "mixed ester mono-ol"), (meth)acryl ester mono-ol and diisocyanate at molar ratio of 1/1/1. The mixed ester mono-ol, thus used for obtaining unsaturated urethane of Formula (1), is a partial ester which is derived from (meth)acrylic acid, long-chain aliphatic acid with 6–22 carbon atoms and trihydric alcohol and has one free hydroxyl group within the molecule.

Examples of trihydric alcohol for deriving aforementioned mixed ester mono-ol include glycerine, trimethylolethane, trimethylolpropane and 1,2,6-hexanetriol. The long-chain aliphatic acid used for deriving aforementioned mixed ester mono-ol is linear or branched saturated aliphatic acid or unsaturated aliphatic acid with 6–22 carbon atoms. Examples of such long-chain aliphatic acid include (1) linear saturated aliphatic acids such as hexanoic acid, octanoic acid, dodecanoic acid and stearic acid, (2) branched saturated aliphatic acids such as iso-octanoic acid, isopalmitic acid and isostearic acid, (3) unsaturated aliphatic acids such as oleic acid and elaidic acid, and (4) their mixtures.

Examples of method for synthesizing the mixed ester mono-ol include the direct esterification reaction of trihydric alcohol, (meth)acrylic acid and long-chain aliphatic acid, the ring-opening addition reaction of long-chain aliphatic acid glycidyl ester and (meth)acrylic acid and ring-opening addition reaction of glycidyl (meth)acrylate and long-chain aliphatic acid. Although the invention does not impose any limitation on the method for synthesizing the mixed ester mono-ol, there results an ester bond between one mole of trihydric alcohol, one mole of (meth)acrylic acid and one mole of long-chain aliphatic acid.

Examples of mixed ester mono-ols thus synthesized include (1) glycerol monomethacrylate.monooctanoate, trimethylolpropane monoacrylate.monoisononanoate, 5-methyl-1,2,4-heptanetriol monomethacrylate.monooleate, and 1,2,6-hexanetriol monomethacrylate.mono 2-ethylhexoate, but mixed mono-ol of glycerine mono(meth)acrylic acid .mono long-chain aliphatic acid can be useful.

Examples of (meth)acrylester mono-ol which can be used for obtaining unsaturated urethane of Formula (1) include partial esters obtained from 1 mole of (meth)acrylic acid and 1 mole of dihydric alcohol and partial ester obtained from 2 moles of (meth)acrylic acid and 1 mole of trihydric alcohol. All such partial esters contain one free hydroxyl group in the molecule.

Examples of such (meth) acrylester mono-ol include (1) mono(meth)acrylates of dihydric alcohol such as 2-hydroxyethyl acrylate, 2-hydroxyethyl methacrylate, 2-hydroxypropyl methacrylate, 4-hydroxybutyl methacrylate, and 1,6-hexanediol monoacrylate, and (2) di(meth)acrylates of trihydric alcohol such as glycerine diacrylate, glycerine dimethacrylate, trimethylol propane dimethacrylate, 5-methyl-1,2,4-heptanetriol dimethacrylate and 1,2,6-hexanetriol dimethacrylate.

Unsaturated urethane shown by Formula (2) is a product of urethane-producing reaction of aforementioned mixed ester mono-ol and diisocyanate at molar ratio of 2:1. Same or different kinds of mixed ester mono-ols may be used for this purpose.

Examples of diisocyanate to be reacted with mixed ester mono-ols and (meth)acryl ester mono-ols, as described above, include (1) aromatic diisocyanates such as all kinds of tolylene diisocyanate and methylene-bis-(4-phenyl isocyanate), (2) aliphatic and alicyclic diisocyanates such as hexamethylene diisocyanate and methylene-bis-(4-cyclohexyl isocyanate), and (3) aliphatic.alicyclic diisocyanates such as 4-isocyanatomethyl-1-isocyanato-1-methylcyclohexane, 5-isocyanatomethyl-1-isocyanato-1,1-dimethyl-5-methyl-cyclohexane (isophorone diisocyanate).

The unsaturated urethane shown by Formula (1) or (2) will be asymmetric if it is obtained by using mutually different kinds of mixed ester mono-ols. In order to synthesize such asymmetric unsaturated urethane, it is preferable to use the kind of diisocyanate with isocyanate groups having different reaction characteristics such as those having both isocyanate group susceptible to the effects of substituent with steric hindrance characteristic and isocyanate group not susceptible to such effects and those having both isocyanate group connected to aliphatic hydrocarbon group and isocyanate group connected to aromatic hydrocarbon group. Examples of such diisocyanate include 2,4-tolylene diisocyanate, isophorone diisocyanate and 4-isocyanatomethyl-1-isocyanato-1-methyl-cyclohexane.

This invention is not intended to limit the method of synthesizing the unsaturated urethane. A known method such as disclosed in Japanese Patent Publication Tokkai 4-53809 may be used. For the synthesis of asymmetric unsaturated urethane, however, it is preferred to preliminarily obtain unsaturated urethane monoisocyanate by reacting one mole of mixed ester mono-ol and 1 mole of aforementioned diisocyanate having isocyanate group with different reaction characteristics and then reacting with (meth)acryl ester mono-ol or a different kind of mixed ester mono-ol.

Of the unsaturated urethanes according to this invention, the ratio between the numbers of polymerizable groups and long-chain hydrocarbon groups contained therein is preferably 2/1 or 3/1 in the case of unsaturated urethane shown by Formula (1) and it is preferably 2/2 in the case of unsaturated urethane shown by Formula (2). Unsaturated urethane obtained by reacting mixed ester mono-ol, mono(meth)acrylate of dihydric alcohol and diisocyanate at molar ratio of 1/1/1 is preferred. In this situation, the ratio between the numbers of polymerizable groups and long- chain hydrocarbon groups is 2/1. It is further preferable according to the invention that both kinds of unsaturated urethane shown by Formulas (1) and (2) should contain both acryloyl and methacryloyl groups as polymerizable groups.

Photocurable resins for stereolithography according to this invention comprise unsaturated urethane shown by Formula (1) or (2), vinyl monomer and photoinitiator, the vinyl monomer being either a single system of N-(meth)acryloyl morpholine or a mixed system of N-(meth) acryloyl morpholine and di-ol di(meth)acrylate. Both N-acryloyl morpholine and N-methacryloyl morpholine are usable but N-acryloyl morpholine is preferred.

Examples of di-ol di(meth)acrylate to be mixed with N-(meth)acryloyl morpholine include (1) diacrylates and dimethacrylates of alkane di-ol with 2–6 carbon atoms such as ethylene glycol, propylene glycol, 1,4-butanediol, neopentenyl glycol and 1,6-hexanediol, (2) diacrylates and dimethacrylates of di-ol having alicyclic hydrocarbon group with 6–12 carbon atoms such as cyclohexane dimethanol, cyclohexene dimethanol and dicyclopentyl dimethanol, (3) diacrylates and dimethacrylates of (poly)ester di-ol such as neopentylglycol hydroxypivalate and 1,6-hexanediol hydroxycaprate obtainable by reacting aliphatic lactone or aliphatic hydroxycarbonic acid with 4–6 carbon atoms with aforementioned alkane di-ol or di-ol, and (4) diacrylates and dimethacylates of alkoxylated bisphenols having alkoxy group with 2–3 carbon atoms such as 2,2-bis(hydroxyethoxyphenyl)propane, 2,2-bis(hydroxydiethoxy-phenyl)-propane, bis(hydroxypropoxyphenyl)methane and bis(hydroxydipropoxyphenyl)methane.

When a mixed system of N-(meth)acryloyl morpholine and di-ol di(meth)acrylate is used as the vinyl monomer according to this invention, it is preferred that 50 weight % or more of N-(meth)acryloyl morpholine be contained in the vinyl monomer and more preferably 60 weight % or more.

The ratio between the unsaturated urethane and vinyl monomer in the photocurable resins according to this invention for stereolithography is 100/25–100/150 by weight, and more preferably 100/40–100/100.

Photocurable resin compositions for stereolithography according to this invention are characterized as having one or more of fillers selected from the group consisting of solid particles of average particle diameter 0.1–50 μm and inorganic whiskers with average fiber length 1–70 μm in a photocurable resin of a type described above. If solid particles are used as the filler, those with average particle diameter 3 μm or greater are preferred. If inorganic whiskers are used as the filler, those with fiber diameter 0.3–1 μm and average fiber length 10 μm or greater are preferred. Examples of such filler include (1) inorganic solid particles such as silica, alumina, clay, calcium carbonate and glass beads, (2) organic solid particles such as crosslinked polystyrene, polymethyl methacrylate and polymethyl siloxane, and (3) inorganic fiber whiskers of potassium titanate fibers, magnesium sulfate fibers, magnesium borate fibers, aluminum borate fibers and carbon fibers. When such a filler is contained, the filler preferably comprises 50–400 weight parts per 100 weight parts of photocurable resin described above. One or more of such fillers can be used, but it is preferred to use both inorganic solid particles and inorganic whiskers at rates of 50–300 weight parts of inorganic solid particles and 10–100 weight parts of inorganic whiskers per 100 weight parts of photocurable resin described above.

When a photocurable resin or its composition according to this invention is used for stereolithography, a photoinitiator is initially caused to be contained therein. The invention does not impose any particular limitation on the kind of photoinitiator to be used, examples of such photoinitiator including (1) carbonyl compounds such as benzoin, α-methyl benzoin, anthraquinone, chloroanthraquinone and acetophenone, (2) sulfur compounds such as diphenyl sulfide, diphenyl disulfide and dithio-carbamate, and (3) polycyclic aromatic compounds such as α-chloromethyl naphthalene and anthracene. The content of photoinitiator in photocurable resin or its composition for stereolithography is generally 0.1–10 weight parts, and more preferably 1–5 weight parts, to 100 weight parts of the resin or the resin composition. In addition to photoinitiator, use may also be made of a co-initiator such as n-butyl amine, triethanol amine, N,N-dimethyl aminobenzene sulfonic diallylamide and N,N-dimethyl aminoethyl methacrylate.

This invention does not impose any particular limitation on the method of stereolithography by the use of a photocurable resin or its composition. Many methods of stereolithography have been known as disclosed, for example, in Japanese Patent Publications Tokkai 56-144478, 60-247515, 1-204915 and 3-41126 and U.S. Pat. No. 4,842,060. According to one of these methods, a photohardening layer is initially formed with a photocurable resin or its composition and the resin or its composition is supplied again on top of the photohardening layer to form another such layer until a desired stereolithographed object is formed. Such a stereolithographed object can be subjected later to a post-cure process. Examples of energy beam which can be used for hardening include visible rays, ultraviolet rays and electron beams, but the use of ultraviolet rays is preferable.

In what follows, test and comparison examples are used to more clearly describe the contents and effects of this invention, but these examples are not intended to define the scope of the invention. In what follows, "parts" will mean "weight parts", and "%" will mean "weight %" unless otherwise specified.

PART 1

Preparation of photocurable resins for stereolithography

Test Examples 1–8 and Comparison Examples 1–5

The method of synthesis described in Japanese Patent Publication Tokkai 6-234818 was used to synthesize unsaturated urethane A-1 (obtained by reacting glycerine monomethacrylate. monooctanoate, hydroxyethyl acrylate and 2,4-tolylene diisocyanate at molar ratio of 1/1/1). Unsaturated urethane A-1 thus synthesized (100 parts) and N-acryloyl morpholine (67 parts) were mixed and dissolved together at room temperature to prepare a photocurable resin for stereolithography (Test Example 1). Photocurable resins according to Test Examples 2–8 and Comparison Examples 1–5 were similarly prepared. Their compositions are shown in Table 1.

TABLE 1

| Examples | Unsaturated Urethane | | Vinyl Monomer | |
|---|---|---|---|---|
| | Type | Parts | Type | Parts |
| Test Examples | | | | |
| 1 | A-1 | 100 | B-1 | 67 |
| 2 | A-2 | 100 | B-1 | 67 |
| 3 | A-3 | 100 | B-1 | 67 |
| 4 | A-1 | 100 | B-1/C-1 | 47/20 |
| 5 | A-2 | 100 | B-1/C-2 | 47/20 |
| 6 | A-3 | 100 | B-1/C-3 | 47/20 |
| 7 | A-2 | 100 | B-2 | 122 |
| 8 | A-3 | 100 | B-2 | 33 |
| Comparison Examples | | | | |
| 1 | A-1 | 100 | C-1 | 67 |
| 2 | A-2 | 100 | C-2 | 67 |
| 3 | A-3 | 100 | C-3 | 67 |
| 4 | A-1 | 100 | B-1/C-1 | 100/200 |
| 5 | A-2 | 100 | B-1/C-2 | 7/3 | where:
A-1: Reaction product of glycerine monomethacrylate. monooctanoate, hydroxyethyl acrylate and 2,4-tolylene diisocyanate at molar ratio of 1/1/1;
A-2: Reaction product of glycerine monomethacrylate. monooctanoate and 2,4-tolylene diisocyanate at molar ratio of 2/1;

A-3: Reaction product of glycerine monomethacrylate. monooctanoate, glycerine diacrylate and isophorone diisocyanate at molar ratio of 1/1/1;
B-1: N-acryloyl morpholine;
B-2: N-methacryloyl morpholine;
C-1: Neopentyl glycol diacrylate;
C-2: Dicyclopentyl dimethylene diacrylate;
C-3: Neopentyl glycol hydroxypivalate diacrylate.

PART 2

Preparation and Evaluation of Stereolithographed Objects (1) Preparation of Stereolithographed Objects Use was made of an equipment for stereolithography provided with a three-dimensional numerically controlled table having a containers set thereto and a helium-cadmium laser beam control system (output=25 mW, wavelength= 3250Å). The container was filled with a liquid mixture having 3 weight parts of 1-hydroxy cyclohexylphenyl ketone dissolved as a photoinitiator for photopolymerization in 100 weight parts of photocurable resin for stereolithography prepared in Part 1. The liquid mixture was supplied from this container to a horizontal surface (defined by X-Y axes) in the thickness of 0.10 mm, and a convergent helium-cadmium laser beam was made incident in the perpendicular direction (along the Z-axis) to harden the photocurable resin. Next, the same liquid mixture was supplied on top of this hardened layer in the thickness of 0.10 mm and hardened in a similar manner. This process was repeated until 200 hardened layers were formed in the shape of a cone with the diameter of the bottom surface equal to 200.00 mm and the height of 20.00 mm. The cone-shaped object thus obtained was washed with isopropyl alcohol and then was subjected to a post-cure process by irradiation from a 3 kW ultraviolet lamp for 30 minutes to obtain a stereolithographed object.

(2) Measurement of Mechanical Properties

As described above in (1), objects in the shape of a dumbbell of thickness 3mm were produced according to JIS (Japanese Industrial Standard) K7113. After the dumbbell-shaped objects were washed with isopropyl alcohol, they were subjected to a post-cure process by heating to 98° C. for 2 hours to obtain test pieces. Three identical test pieces were used to measure their tensile strength (TS), tensile elastic modulus (TEM) and tensile elongation (TE) according to JIS K7113 at tensile rate of 5 mm/second. Toughness factor (Tf) defined as the product of the tensile strength and tensile elongation was calculated for each test piece. The averages of values obtained for three test pieces are shown in Table 2.

(3) Measurement of Thermal Properties

Planar test pieces of dimensions 55 mm×10 mm×2mm were produced as described above in (2) and their dynamic viscoelasticity was measured to obtain their glass transition temperatures (Tg) indicated by tan δ. The results are also shown in Table 2.

(4) Measurement of shapes

Two-dimensional figure (FIG. a) was obtained by vertical projection of each of the stereolithographed objects obtained in (1) onto the X-Y plane. Each of these objects was also projected horizontally onto 50 arbitrary planes perpendicular to the X-Y plane to obtain two-dimensional figures (FIG. b).

FIG. a is a circle. Fifty arbitrary straight lines were drawn through the center of gravity of FIG. a and the distance between the two points at which each straight line crosses the figure was measured. The maximum (Max), minimum (Min) and average (Ave) values of these measured distances and their standard deviation (SD) were calculated. FIG. b are triangles, and their areas were measured. The maximum (Max), minimum (Min) and average (Ave) values of these measured areas and their standard deviation (SD) were calculated. The results are shown in Table 3. In Tables 2 and 3, Comparison Example 6 is the ABS resin DIAPET HF-5 (produced by Mitsubishi Rayon Company, Ltd.), and test pieces for Comparison Example 6 were obtained by mold injection with cylinder temperature 200° C. and mold temperature 60° C. The shapes and dimensions of the injected test pieces were the same as described in (2) and (3) above.

PART 3

Preparation of Photocurable Resin Compositions for Stereolithography

Test Examples 9–12 and Comparison Examples 7 and 8

Photocurable resin according to Test Example 1 in Part 1 for stereolithography (100 weight parts), photoinitiator (3 weight parts), inorganic solid particles (200 weight parts) and inorganic whiskers (50 weight parts) were placed inside a mixing container equipped with a two-shaft stirring device, and the mixture was stirred until it became uniform. The stirred mixture was filtered through a 50 μm-filter to prepare Test Example 9 of photocurable resin composition. Test Examples 10–12 and Comparison Examples 7 and 8 were similarly prepared. Their compositions are shown in Table 4.

TABLE 2

| Examples | Mechanical Properties | | | | Thermal Properties |
|---|---|---|---|---|---|
| | Tensile Strength (kgf/mm$^2$) | Tensile Elastic Modulus (kgf/mm$^2$) | Tensile Elongation (%) | Tf (Kgf/mm$^2$) | Tg (°C.) |
| Test Example | | | | | |
| 1 | 9.8 | 316 | 7.0 | 69 | 134 |
| 2 | 7.7 | 296 | 8.2 | 63 | 122 |
| 3 | 10.2 | 334 | 5.9 | 60 | 145 |
| 4 | 9.6 | 315 | 6.1 | 59 | 126 |
| 5 | 7.4 | 301 | 7.7 | 57 | 118 |
| 6 | 9.5 | 298 | 5.8 | 55 | 131 |
| 7 | 8.3 | 322 | 7.0 | 58 | 128 |
| 8 | 11.4 | 357 | 4.9 | 56 | 161 |
| Comparison Example | | | | | |
| 1 | 6.4 | 310 | 4.1 | 26 | 118 |
| 2 | 6.5 | 282 | 3.2 | 21 | 109 |
| 3 | 8.2 | 314 | 2.8 | 23 | 114 |
| 4 | 6.8 | 306 | 2.8 | 19 | 125 |
| 5 | 7.6 | 287 | 3.3 | 25 | 107 |
| 6 | 4.1 | 250 | 11.5 | 47 | 110 |

TABLE 3

| | Shape | | | | | | | |
|---|---|---|---|---|---|---|---|---|
| | FIG. a | | | | FIG. b | | | |
| Examples | Ave (mm) | Max (mm) | Min (mm) | SD (mm) | Ave (mm²) | Max (mm²) | Min (mm²) | SD (mm²) |
| Test Examples | | | | | | | | |
| 1 | 199.21 | 199.42 | 199.02 | 0.09 | 1986 | 1990 | 1982 | 1.9 |
| 2 | 199.30 | 199.51 | 199.08 | 0.10 | 1987 | 1990 | 1983 | 1.8 |
| 3 | 199.08 | 199.34 | 198.83 | 0.12 | 1983 | 1987 | 1978 | 2.0 |
| 4 | 199.05 | 199.43 | 198.66 | 0.18 | 1983 | 1988 | 1978 | 2.6 |
| 5 | 199.22 | 199.57 | 198.86 | 0.16 | 1985 | 1990 | 1979 | 2.5 |
| 6 | 199.02 | 199.35 | 198.69 | 0.15 | 1982 | 1988 | 1975 | 2.8 |
| 7 | 199.16 | 199.64 | 198.66 | 0.23 | 1985 | 1992 | 1977 | 3.2 |
| 8 | 199.19 | 199.61 | 198.77 | 0.20 | 1985 | 1992 | 1978 | 3.0 |
| Comparison Example | | | | | | | | |
| 1 | 198.29 | 199.38 | 197.21 | 0.51 | 1973 | 1995 | 1950 | 10.2 |
| 2 | 198.64 | 199.53 | 197.75 | 0.42 | 1977 | 1996 | 1957 | 8.9 |
| 3 | 198.36 | 199.33 | 197.38 | 0.46 | 1974 | 1994 | 1954 | 9.3 |
| 4 | 198.55 | 199.42 | 197.66 | 0.40 | 1977 | 1995 | 1958 | 8.8 |
| 5 | 198.82 | 199.65 | 197.99 | 0.39 | 1979 | 1999 | 1962 | 7.8 |
| 6 | — | — | — | — | — | — | — | — |

TABLE 4

| | Photocurable Resin | | Inorganic Whiskers | | Inorganic Solid Particles | | Photo-initiator | |
|---|---|---|---|---|---|---|---|---|
| | Kind | Amount (Part) | Kind | Amount (Part) | Kind | Amount (Part) | Kind | Amount (Part) |
| Test Example | | | | | | | | |
| 9 | Test Ex. 1 | 100 | D-1 | 50 | E-1 | 200 | F-1 | 3 |
| 10 | Test Ex. 3 | 100 | D-1 | 50 | E-1 | 200 | F-1 | 3 |
| 11 | Test Ex. 4 | 100 | D-1 | 50 | E-1 | 200 | F-1 | 3 |
| 12 | Test Ex. 7 | 100 | D-1 | 40 | E-2 | 150 | F-1 | 3 |
| Comparison Example | | | | | | | | |
| 7 | Comp. Ex. 1 | 100 | D-1 | 50 | E-1 | 200 | F-1 | 3 |
| 8 | Comp. Ex. 3 | 100 | D-1 | 50 | E-1 | 200 | F-1 | 3 | where:

D-1: Aluminum borate whiskers with average diameter 0.8 μm and average fiber length 20 μm (ALBOREX YS-4 produced by Shikoku Chemical Corporation);

E-1: Glass beams with average particle diameter 30 μm (GB-730C produced by Toshiba Ballotini Co., Ltd);

E-2: Aluminum hydroxide with average particle diameter 8 μm (B-103 produced by Nippon Light Metal Co., Ltd);

F-1: 1-hydroxy cyclohexyl phenylketone.

PART 4

Preparation and Evaluation of Stereolithographed Objects (1) Preparation of Stereolithographed Objects Use was made of the photocurable resin compositions for stereolithography prepared in Part 3 to form cone-shaped objects as done in Part 2. The objects thus obtained were washed with isopropyl alcohol and then subjected to a post-cure process by heating to 98° C. for 2 hours.

(2) Measurement of Physical and Thermal Properties and Shape

Mechanical and thermal properties and shape were measured on test pieces prepared separately as done in Part 2 as well as on the objects prepared in (1) above. The results are shown in Tables 5 and 6.

TABLE 5

| Examples | Mechanical Properties | | | | Thermal Properties |
|---|---|---|---|---|---|
| | Tensile Strength (kgf/mm$^2$) | Tensile Elastic Modulus (kgf/mm$^2$) | Tensile Elongation (%) | Tf (Kgf/mm$^2$) | Tg (°C.) |
| Test Examples | | | | | |
| 9 | 7.9 | 1040 | 2.0 | 16 | 138 |
| 10 | 8.2 | 1210 | 2.0 | 16 | 147 |
| 11 | 7.7 | 1040 | 1.9 | 15 | 130 |
| 12 | 6.1 | 1000 | 2.6 | 16 | 131 |
| Comparison Example | | | | | |
| 7 | 4.9 | 990 | 1.5 | 7.4 | 122 |
| 8 | 5.7 | 1020 | 1.4 | 8.0 | 117 |

TABLE 6

| Examples | Shape | | | | | | | |
|---|---|---|---|---|---|---|---|---|
| | FIG. A | | | | FIG. B | | | |
| | Ave (mm) | Max (mm) | Min (mm) | SD (mm) | Ave (mm$^2$) | Max (mm$^2$) | Min (mm$^2$) | SD (mm$^2$) |
| Test Examples | | | | | | | | |
| 9 | 199.60 | 199.67 | 199.52 | 0.03 | 1993 | 1996 | 1991 | 1.0 |
| 10 | 199.46 | 199.57 | 199.34 | 0.05 | 1990 | 1992 | 1987 | 1.1 |
| 11 | 199.39 | 199.54 | 199.23 | 0.07 | 1989 | 1993 | 1985 | 1.9 |
| 12 | 199.51 | 199.70 | 199.31 | 0.09 | 1992 | 1996 | 1987 | 2.0 |
| Comparison Example | | | | | | | | |
| 7 | 199.10 | 199.58 | 198.63 | 0.22 | 1983 | 1993 | 1972 | 4.5 |
| 8 | 199.16 | 199.56 | 198.75 | 0.19 | 1984 | 1992 | 1975 | 3.9 |

In Comparison Examples 7 and 8, cracks were observed on the surface of the test objects.

From the description presented above, it can be understood clearly that the present invention can provide stereolithographed objects with superior mechanical and thermal properties and form precision.

What is claimed is:

1. A photocurable resin for stereolithography comprising unsaturated urethane shown by Formula (1) or Formula (2) given below:

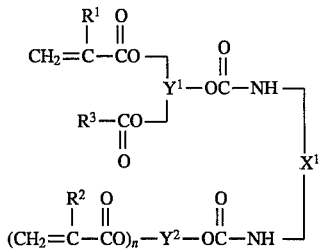

(Formula 1)

(Formula 2)

and a vinyl monomer and a photoinitiator, said vinyl monomer being N-(meth)acryloyl selected from N-acryloyl morpholine, N-methacryloyl morpholine and a mixture thereof or a mixture of said N-(meth)acryloyl morpholine and di-ol di(meth)acrylate selected from di-ol diacrylate, di-ol dimethacrylate and a mixture thereof, the ratio between said unsaturated urethane and said vinyl monomer being 100/25–100/150 by weight, wherein $X^1$ and $X^2$ are each a residual group obtained by removing isocyanate groups from diisocyanate; $Y^1$, $Y^3$ and $Y^4$ are each a residual group obtained by removing hydroxyl groups from trihydric alcohol; $Y^2$ is a residual group obtained by removing hydroxyl groups from dihydric or trihydric alcohol; $R^1$, $R^2$, $R^4$ and $R^5$ are each H or CH$_3$; R$^3$, R$^6$ and R$^7$ are each alkyl group with 5–21 carbon atoms; and n is either 1 or 2.

2. The photocurable resin for stereolithography of claim 1 wherein said unsaturated urethane given by Formula (1) or (2) contains both acryloyl group and methacryloyl group in the molecule thereof.

3. The photocurable resin for stereolithography of claim 2 wherein said vinyl monomer contains N-(meth)acryloyl morpholine by 50 weight % or more and one or more di-ol di(meth)acrylates by 50 weight % or less.

4. The photocurable resin for stereolithography of claim 3 wherein said one or more di-ol di(meth)acrylates are selected from the di(meth)acrylate group consisting of diacrylates and dimethacrylates of alkane di-ols having 2–6 carbon atoms, diacrylates and dimethacrylates of di-ols having alicyclic hydrocarbon group with 6–12 carbon atoms, diacrylates and dimethacrylates and dimethacrylates of esterdiols obtained by reacting alkane di-ol with 2–6 carbons atoms with monohydroxyl carboxylic acid with 4–6 carbon atoms, and diacrylates and dimethacrylates of alkoxylated bisphenols having alkoxy group with 2–3 carbon atoms.

5. A photocurable resin composition for stereolithography comprising the photocurable resin of claim 4 for stereolithography and 50–400 weight parts of at least one filler selected from the group consisting of solid particles with average particle diameter 0.1–50 μm and inorganic whiskers with average fiber length 1–70 μm for 100 weight parts of said photocurable resin.

6. The photocurable resin composition of claim 5 for stereolithography wherein said filler consists of 10–100 weight parts of said inorganic whiskers and 50–300 weight parts of inorganic solid particles.

7. The photocurable resin for stereolithography of claim 1 wherein said vinyl monomer contains N-(meth)acryloyl morpholine by 50 weight % or more and one or more di-ol di(meth)acrylates by 50 weight % or less.

8. The photocurable resin for stereolithography of claim 7 wherein said one or more di-ol di(meth)acrylates are selected from the group consisting of diacrylates and dimethacrylates of alkane di-ols having 2–6 carbon atoms, diacrylates and dimethacrylates of di-ols having alicyclic hydrocarbon group with 6–12 carbon atoms, diacrylates and dimethacrylates of esterdiols obtained by reacting alkane di-ol with 2–6 carbons atoms with monohydroxyl carboxylic acid with 4–6 carbon atoms, and diacrylates and dimethacrylates of alkoxylated bisphenols having alkoxy group with 2–3 carbon atoms.

9. A photocurable resin composition for stereolithography comprising the photocurable resin of claim 8 for stereolithography and 50–400 weight parts of at least one filler selected from the group consisting of solid particles with average particle diameter 0.1–50 μm and inorganic whiskers with average fiber length 1–70 μm for 100 weight parts of said photocurable resin.

10. The photocurable resin composition of claim 9 for stereolithography wherein said filler consists of 10–100 weight parts of said inorganic whiskers and 50–300 weight parts of inorganic solid particles.

11. A photocurable resin composition for stereolithography comprising the photocurable resin of claim 1 for stereolithography and 50–400 weight parts of at least one filler selected from the group consisting of solid particles with average particle diameter 0.1–50 μm and inorganic whiskers with average fiber length 1–70 μm for 100 weight parts of said photocurable resin.

12. The photocurable resin composition of claim 11 for stereolithography wherein said filler consists of 10–100 weight parts of said inorganic whiskers and 50–300 weight parts of inorganic solid particles.

* * * * *